(12) United States Patent
Han et al.

(10) Patent No.: US 12,376,481 B2
(45) Date of Patent: Jul. 29, 2025

(54) DISPLAY APPARATUS AND METHOD OF MANUFACTURING THE SAME

(71) Applicant: Samsung Display Co., Ltd., Yongin-Si (KR)

(72) Inventors: Jaebum Han, Yongin-si (KR); Younggil Park, Yongin-si (KR); Moonsung Kim, Yongin-si (KR); Jaisun Kyoung, Yongin-si (KR); Kihyun Kim, Yongin-si (KR); Sooim Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 325 days.

(21) Appl. No.: 17/382,425

(22) Filed: Jul. 22, 2021

(65) Prior Publication Data

US 2022/0173186 A1    Jun. 2, 2022

(30) Foreign Application Priority Data

Nov. 27, 2020 (KR) ............ 10-2020-0163051

(51) Int. Cl.
*H10K 77/10* (2023.01)
*H10K 59/12* (2023.01)
*H10K 59/124* (2023.01)

(52) U.S. Cl.
CPC ........... *H10K 77/10* (2023.02); *H10K 59/124* (2023.02); *H10K 59/12* (2023.02); *H10K 59/1201* (2023.02)

(58) Field of Classification Search
CPC .. H10K 59/1201; H10K 59/12; H10K 59/124; H10K 77/10
See application file for complete search history.

(56) References Cited

U.S. PATENT DOCUMENTS

| | | | |
|---|---|---|---|
| 7,501,673 B2 | 3/2009 | Park et al. | |
| 7,547,643 B2 | 6/2009 | Schmitt et al. | |
| 7,999,266 B2 | 8/2011 | Kianyu et al. | |
| 9,305,984 B2 | 4/2016 | Kang | |
| 10,253,550 B1* | 4/2019 | Kim | C03C 27/10 |
| 10,586,925 B2 | 3/2020 | Usukura et al. | |
| 11,985,854 B2 | 5/2024 | Seo et al. | |
| 2006/0223249 A1* | 10/2006 | Park | H10D 84/0174 |
| | | | 257/E21.636 |

(Continued)

FOREIGN PATENT DOCUMENTS

| | | |
|---|---|---|
| JP | 2018-182295 A | 11/2018 |
| KR | 10-2006-0106866 A | 10/2006 |

(Continued)

*Primary Examiner* — Vongsavanh Sengdara
(74) *Attorney, Agent, or Firm* — Innovation Counsel LLP

(57) ABSTRACT

Provided are a display apparatus with improved display quality and a method of manufacturing the same, the display apparatus including: a substrate including a first base layer, a second base layer arranged over the first base layer, and a first barrier layer disposed between the first base layer and the second base layer; a first thin-film transistor arranged over the substrate and including a first semiconductor layer and a first gate electrode, wherein the first barrier layer includes a first sub-layer and a second sub-layer disposed on the first sub-layer, the first sub-layer including an inorganic material and the second sub-layer including amorphous silicon and crystallized silicon.

12 Claims, 12 Drawing Sheets

(56) References Cited

U.S. PATENT DOCUMENTS

| | | | | |
|---|---|---|---|---|
| 2015/0123098 A1* | 5/2015 | Kang | ............... | H10K 59/123 |
| | | | | 438/151 |
| 2016/0176707 A1* | 6/2016 | Montez | ............... | B81B 3/001 |
| | | | | 257/415 |
| 2020/0144309 A1 | 5/2020 | Jeon et al. | | |
| 2022/0326581 A1* | 10/2022 | Kimura | ............ | G02F 1/134363 |
| 2023/0387134 A1* | 11/2023 | Zhao | ............... | H10K 71/231 |

FOREIGN PATENT DOCUMENTS

| KR | 10-1141459 B1 | 5/2013 |
|---|---|---|
| KR | 10-1356693 B1 | 1/2014 |
| KR | 10-2015-0052645 A | 5/2015 |
| KR | 10-2016-0017157 A | 2/2016 |
| KR | 10-2020-0052782 A | 5/2020 |
| KR | 10-2020-0108146 A | 9/2020 |

\* cited by examiner

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2020-0163051, filed on Nov. 27, 2020, in the Korean Intellectual Property Office, the disclosure of which is incorporated by reference herein in its entirety.

BACKGROUND

1. Field

One or more embodiments relate to a display apparatus and a method of manufacturing the same, and more particularly, to a display apparatus with improved display quality and a method of manufacturing the same.

2. Description of the Related Art

As the field of displays that visually express various pieces of electric signal information rapidly develops, various display apparatuses have been introduced with excellent characteristics, such as being thinner and more lightweight, and low power consumption. An organic light-emitting display apparatus has advantages of wide viewing angles, excellent contrast, and fast response speeds, and thus, is in the limelight as the next-generation display apparatus.

Such a display apparatus includes a thin-film transistor TFT and a capacitor as a driving circuit. Here, a thin-film transistor may include a semiconductor layer and a gate electrode, the semiconductor layer including a channel region, a source region, and a drain region, and the gate electrode being electrically insulated from the semiconductor layer by a gate insulating layer. Generally, a semiconductor layer of a thin-film transistor may include amorphous silicon or polycrystalline silicon.

SUMMARY

In display apparatuses according to the related art, during a process of variously implementing the structure of a thin-film transistor to increase the accuracy of controlling whether a display element emits light and controlling a degree of light emission, the characteristics of some of thin-film transistors have been changed and deteriorated, and thus, display quality has been deteriorated.

One or more embodiments include a display apparatus with an improved display quality and a method of manufacturing the same. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate including a first base layer, a second base layer arranged over the first base layer, and a first barrier layer disposed between the first base layer and the second base layer, a first thin-film transistor arranged over the substrate and including a first semiconductor layer and a first gate electrode, wherein the first barrier layer includes a first sub-layer and a second sub-layer disposed on the first sub-layer, the first sub-layer including an inorganic material, and the second sub-layer including amorphous silicon and crystallized silicon.

The crystallized silicon in the second sub-layer may be about 2% to about 25%.

The display apparatus may further include a second thin-film transistor arranged over the substrate and including a second semiconductor layer and a second gate electrode. The first semiconductor layer may include a silicon-based semiconductor material, and the second semiconductor layer may include an oxide-based semiconductor material.

The first semiconductor layer and the second semiconductor layer may be arranged on different layers.

The display apparatus may further include a gate insulating layer arranged between the first semiconductor layer and the first gate electrode, and an interlayer insulating layer arranged between the first gate electrode and the second semiconductor layer.

The second semiconductor layer may be arranged directly on the interlayer insulating layer.

The display apparatus may further include a bottom metal layer arranged between the substrate and the second semiconductor layer, the bottom metal layer being disposed on an area corresponding to the second semiconductor layer.

The first semiconductor layer may not overlap the bottom metal layer in a plan view.

The substrate may further include a second barrier layer disposed on the second base layer and including an inorganic material.

The display apparatus may further include a buffer layer arranged on the second barrier layer, wherein the first semiconductor layer may be arranged directly on the buffer layer.

The second sub-layer may have a surface roughness of about 0.02 nm to about 0.5 nm.

The second sub-layer may have a hydrogen concentration of about 4.0 E+21 atom/cm$^3$ to about 6.0 E+21 atom/cm$^3$.

The second sub-layer may have an extinction coefficient of about 0.01 to about 0.025.

The second sub-layer may have a thickness of about 5 Å to about 100 Å.

The first sub-layer may have a thickness of about 4000 Å to about 7000 Å.

According to one or more embodiments, a method of manufacturing a display apparatus includes forming a first base layer on a support substrate, forming a first sub-layer on the first base layer, the first sub-layer including an inorganic material, forming a second sub-layer on the first sub-layer, the second sub-layer including amorphous silicon and crystallized silicon, forming a second base layer on the second sub-layer, forming a first thin-film transistor on the second base layer, and forming a second thin-film transistor on the second base layer.

The crystallized silicon in the second sub-layer may be about 2% to about 25%.

In the forming of the second sub-layer, power may be about 2100 W to about 2800 W.

In the forming of the second sub-layer, a fraction of an inert gas to a reaction gas is greater than 100 and less than 200.

The inert gas may be argon (Ar) and the reaction gas may be silane (SiH$_4$).

These and/or other aspects will become apparent and more readily appreciated from the following description of the embodiments, the accompanying drawings, and claims.

These general and specific aspects may be implemented by using a system, a method, a computer program, or a combination of a certain system, method, and computer program.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
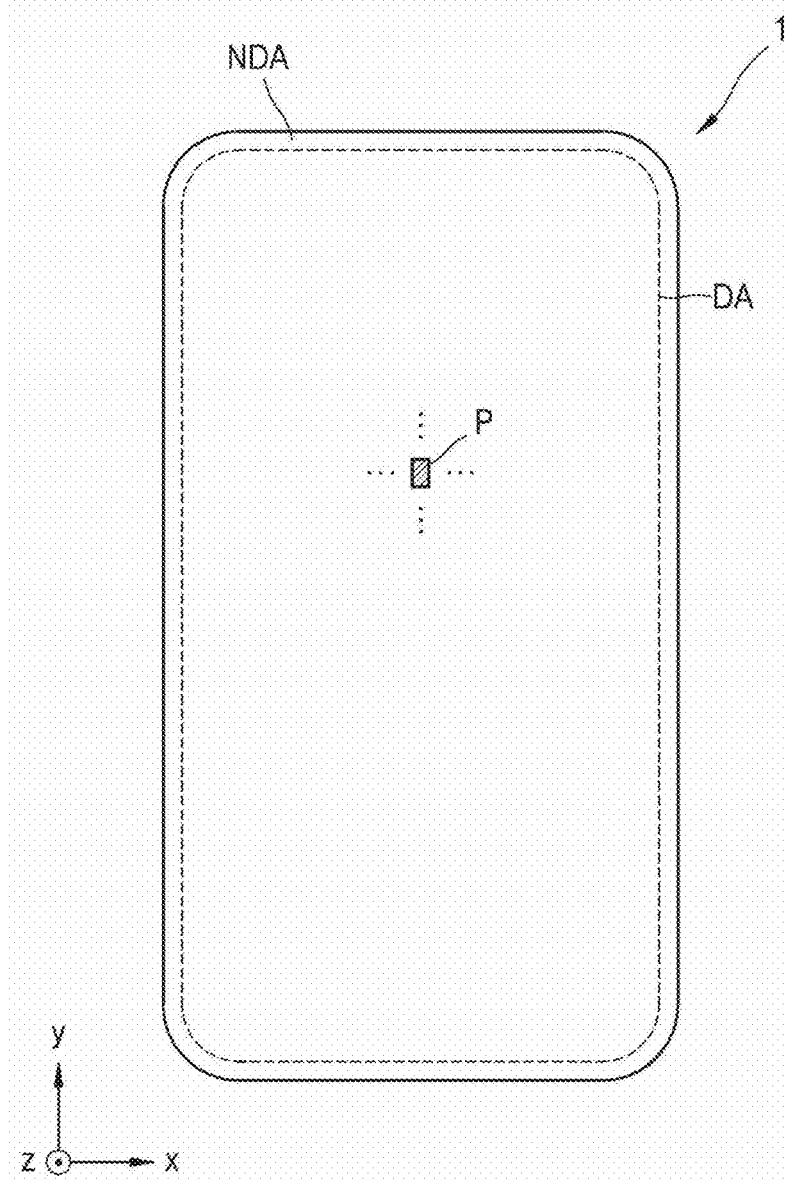
FIG. 1 is a plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the present specification, "A and/or B" means A or B, or A and B. In the present specification, "at least one of A and B" means A or B, or A and B.

In the following examples, the x-axis, the y-axis and the z-axis are not limited to three axes of the rectangular coordinate system and may be interpreted in a broader sense. For example, the x-axis, the y-axis, and the z-axis may be perpendicular to one another, or may represent different directions that are not perpendicular to one another.

When an embodiment may be implemented differently, a certain process order may be performed differently from the described order. For example, two consecutively described processes may be performed substantially at the same time or performed in an order opposite to the described order.

FIG. 1 is a plan view of a display apparatus 1 according to an embodiment.

Referring to FIG. 1, the display apparatus 1 includes a display area DA and a peripheral area NDA outside the display area DA. A plurality of pixels P each including a display element are arranged in the display area DA. The display apparatus 1 may provide an image by using light emitted from the plurality of pixels P arranged in the display area DA. The peripheral area NDA is a kind of a non-display area in which display elements are not arranged. The display area DA may be entirely surrounded by the peripheral area NDA.

Though FIG. 1 shows the display apparatus 1 having a flat display surface, the embodiment is not limited thereto. In another embodiment, the display apparatus 1 may include a three-dimensional display surface or a curved display surface.

In the case where the display apparatus 1 includes a three-dimensional display surface, the display apparatus 1 may include a plurality of display areas indicating different directions and include, for example, a polygonal column type display surface. In another embodiment, in the case where the display apparatus 1 includes a curved display surface, the display apparatus 1 may be implemented as various types such as flexible, foldable, and rollable display apparatuses.

In addition, in an embodiment, FIG. 1 shows the display apparatus 1 applicable to a mobile phone. Though not shown, electronic modules, a camera module, a power module, etc. mounted on a main board may be arranged in a bracket/case in cooperation with the display apparatus 1 to constitute a mobile phone. The display apparatus 1 according to an embodiment is applicable to small and medium-scale electronic apparatuses such as tablets, automobile navigations, game consoles, and smartwatches as well as large-scale electronic apparatuses such as televisions and monitors.

Though FIG. 1 shows the case where the display area DA of the display apparatus 1 is a quadrangle and the corner portion is round, the display area DA may have a shape such as a circular shape, an elliptical shape, or polygons such as triangles or pentagons.

Hereinafter, though an organic light-emitting display apparatus is described as an example of the display apparatus 1 according to an embodiment, the display apparatus is not limited thereto. In another embodiment, the display apparatus 1 according to an embodiment may be a display apparatus such as an inorganic light-emitting display or a quantum-dot light-emitting display. As an example, an emission layer of a display element of the display apparatus 1 may include an organic material, an inorganic material, quantum dots, an organic material and quantum dots, or an inorganic material and quantum dots.

Figure 2:
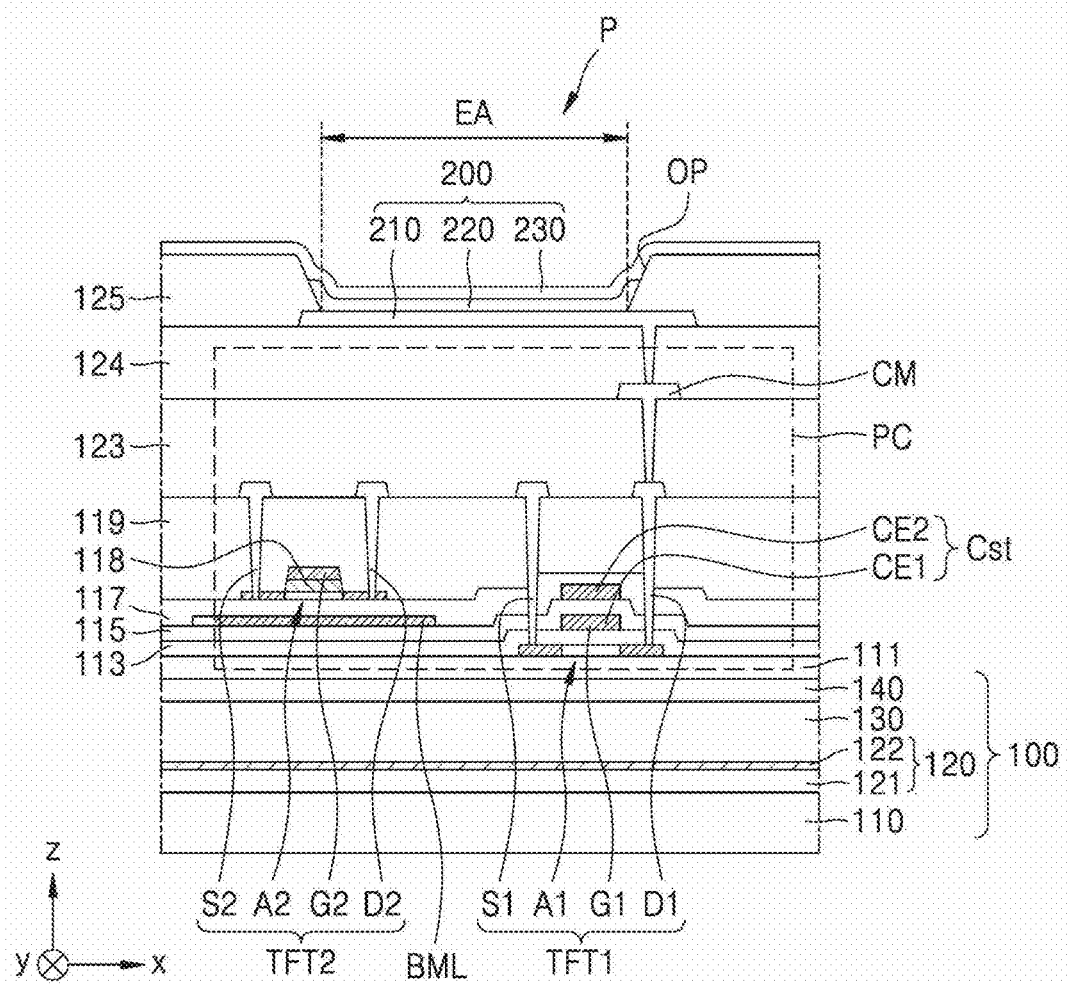
FIG. 2 is a cross-sectional view of a portion of a display apparatus according to an embodiment.
Figure 3:
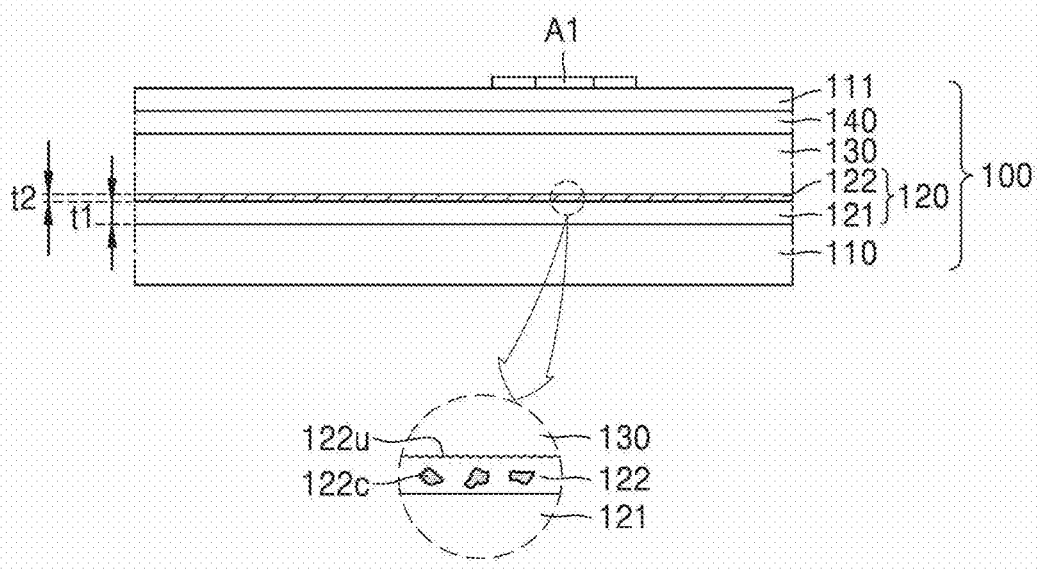
FIG. 3 is a cross-sectional view of a substrate structure of FIG. 2 according to an embodiment.

FIG. 2 is a cross-sectional view of a portion of the display apparatus 1 according to an embodiment, and FIG. 3 is a cross-sectional view of a substrate structure of FIG. 2 according to an embodiment.

Referring to FIG. 2, a pixel circuit PC and an organic light-emitting diode OLED electrically connected thereto may be arranged over a substrate 100, the pixel circuit PC including a first thin-film transistor TFT1, a second thin-film transistor TFT2, and a storage capacitor Cst. In an embodiment, the pixel circuit PC may include a plurality of thin-film transistors in addition to the first thin-film transistor TFT1 and the second thin-film transistor TFT2. As an example, the pixel circuit PC may include six or seven thin-film transistors and one storage capacitor.

The substrate 100 may include glass, a ceramic material, a metal material, or a flexible or bendable material. In the case where the substrate 100 has a flexible or bendable characteristic, the substrate 100 may include a base layer including an organic material.

The substrate 100 may have a multi-layered structure. In an embodiment, the substrate 100 may include a first base layer 110, a first barrier layer 120, a second base layer 130, and a second barrier layer 140. In another embodiment, the second base layer 130 and the second barrier layer 140 may be omitted from the substrate 100. The second base layer 130 may be arranged on the first base layer 110. The first barrier layer 120 may be arranged between the first base layer 110 and the second base layer 130. The second barrier layer 140 may be arranged on the second base layer 130.

The first base layer 110 and the second base layer 130 may include an organic material, and thus, a flexible or bendable characteristic may be given to the substrate 100. The first base layer 110 and the second base layer 130 may each include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate.

The first barrier layer 120 and the second barrier layer 140 may each include an inorganic material and prevent or reduce impurities from the substrate 100, etc. from penetrating to semiconductor layers, that is, a first semiconductor layer A1 and a second semiconductor layer A2). The first barrier layer 120 and the second barrier layer 140 may each include an inorganic material such as an oxide or a nitride, an organic material, or an organic/inorganic composite material and have a single-layered structure or a multi-layered structure including an inorganic material and an organic material.

A buffer layer 111 may be arranged on the substrate 100. The buffer layer 111 may be arranged right on the second barrier layer 140. Accordingly, the buffer layer 111 may contact the top surface of the second barrier layer 140. The buffer layer 111 may prevent or reduce impurities from the substrate 100, etc. from penetrating into the semiconductor layers, that is, the first semiconductor layer A1 and the second semiconductor layer A2. The buffer layer 111 may include, for example, silicon oxide ($SiO_x$), silicon nitride ($SiN_x$), or silicon oxynitride (SiON). The buffer layer 111 may include the same material as the second barrier layer 140 or include a material different from the second barrier layer 140.

The first semiconductor layer A1 of the first thin-film transistor TFT1 may be arranged on the buffer layer 111. In an embodiment, the first semiconductor layer A1 may include a silicon-based semiconductor material, for example, amorphous silicon or polycrystalline silicon. As an example, the first semiconductor layer A1 may include low temperature polycrystalline silicon (LTPS). The first semiconductor layer A1 may include a channel region, a source region, and a drain region, the source region and the drain region being arranged on two opposite sides of the channel region. The first semiconductor layer A1 may include a single layer or a multi-layer.

A first gate insulating layer 113 and a second gate insulating layer 115 may each be stacked over the substrate 100 to cover the first semiconductor layer A1. The first gate insulating layer 113 and the second gate insulating layer 115 may each include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A first gate electrode G1 of the first thin-film transistor TFT1 may be arranged on the first gate insulating layer 113 between the first gate insulating layer 113 and the second gate insulating layer 115.

In an embodiment, the storage capacitor Cst may include a first electrode CE1 and a second electrode CE2. As shown in FIG. 2, the storage capacitor Cst may overlap the first gate electrode G1 of the first thin-film transistor TFT1. As an example, the first gate electrode G1 of the first thin-film transistor TFT1 may serve as the first electrode CE1 of the storage capacitor Cst. Unlike this, the storage capacitor Cst may not overlap the first thin-film transistor TFT1 and be present separately.

The second electrode CE2 of the storage capacitor Cst may overlap the first electrode CE1 in a plan view with the second gate insulating layer 115 disposed between the first electrode CE1 and the second electrode CE2 to constitute a capacitance. In this case, the second gate insulating layer 115 may serve as a dielectric layer of the storage capacitor Cst.

A first interlayer insulating layer 117 and a second interlayer insulating layer 119 may be disposed on the second gate insulating layer 115 to cover the second electrode CE2 of the storage capacitor Cst. The first interlayer insulating layer 117 and the second interlayer insulating layer 119 may each include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second semiconductor layer A2 may be arranged on the first interlayer insulating layer 117 between the first interlayer insulating layer 117 and the second interlayer insulating layer 119. In an embodiment, the second semiconductor layer A2 may include an oxide semiconductor material. The second semiconductor layer A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

As an example, the second semiconductor layer A2 may include an oxide-based semiconductor material. The second semiconductor layer A2 may be, for example, an ITZO (InSnZnO) semiconductor layer and an IGZO (InGaZnO) semiconductor layer. Because an oxide semiconductor has a wide band gap (about 3.1 eV), a high carrier mobility and a low leakage current, a voltage drop is not large even though a driving time is long, and thus, the oxide semiconductor has an advantage that a brightness change due to a voltage drop is not large while the display apparatus is driven at a low frequency.

A bottom metal layer BML may be arranged between the second semiconductor layer A2 and the substrate 100. The bottom metal layer BML may include a conductive material including molybdenum (Mo), aluminum (Al), copper (Cu), and titanium (Ti) and have a single-layered structure or a multi-layered structure including the above materials. As an example, the bottom metal layer BML may have a multi-layered structure of Ti/Al/Ti.

In an embodiment, the bottom metal layer BML may overlap the second semiconductor layer A2 including an oxide semiconductor material. Because the second semiconductor layer A2 including an oxide semiconductor material has a characteristic vulnerable to light, the bottom metal layer BML may prevent a photo current from being induced by external light incident from a side of the substrate 100, and thus, prevent an element characteristic of the second thin-film transistor TFT2 including an oxide semiconductor material from being changed.

A third gate insulating layer 118 may be arranged on the second semiconductor layer A2. The third gate insulating layer 118 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A region of the second semiconductor layer A2 that overlaps the third gate insulating layer 118 may be a channel region, and other regions may be respectively a source region and a drain region. Though it is shown in FIG. 2 that the third gate insulating layer 118 is patterned in a shape of the second gate electrode A2 of the second thin-film transistor TFT2 as an example, the embodiment is not limited thereto. In another embodiment, the third gate insulating layer 118 may not be patterned and may be arranged over the entire surface of the substrate 100 to cover the second semiconductor layer A2 entirely.

A second gate electrode G2 may be arranged on the third gate insulating layer 118 to overlap at least a portion of the second semiconductor layer A2.

Source electrodes S1 and S2 and drain electrodes D1 and D2 may be arranged on the second interlayer insulating layer 119.

The source electrodes S1 and S2 and the drain electrodes D1 and D2 may include a conductive material including molybdenum (Mo), aluminum (Al), copper (Cu), and titanium (Ti) and have a single-layered structure or a multi-layered structure including the above materials. As an example, the source electrodes S1 and S2 and the drain electrodes D1 and D2 may each have a multi-layered structure of Ti/Al/Ti. The source electrodes S1 and S2 and the drain electrodes D1 and D2 may be connected to source regions or drain regions of the semiconductor layers A1 and A2 through contact holes, respectively.

The source electrodes S1 and S2 and the drain electrodes D1 and D2 may each be covered by an inorganic protective layer (not shown). The inorganic protective layer may be a single layer or a multi-layer including $SiN_x$ and $SiO_x$. The inorganic protective layer may be introduced to cover and protect some of wirings arranged on the second interlayer insulating layer 119.

In an embodiment, the first thin-film transistor TFT1 may be a driving thin-film transistor, and the second thin-film transistor TFT2 may be a switching thin-film transistor TFT2. In an embodiment, the first thin film transistor TFT1 and the second thin-film transistor TFT2 may be thin-film transistors from among a plurality of transistors, that is, first to seventh transistors T1, T2, T3, T4, T5, T6, and T7 included in the pixel circuit PC. In this case, as an example, the second thin-film transistor TFT2 may be at least one of the third transistor T3 and the fourth transistor T4 of FIG. 9.

A planarization layers 123 and 124 may be arranged on the second interlayer insulating layer 119. An organic light-emitting diode 200 may be arranged on the planarization layers 123 and 124.

The planarization layers 123 and 124 may include a single layer or a multi-layer including an organic material and provide a flat top surface. The planarization layer 123 and 124 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In an embodiment, as shown in FIG. 2, the planarization layers 123 and 124 may be provided in a multi-layer and may include a first planarization layer 123 and a second planarization layer 124. The first planarization layer 123 and the second planarization layer 124 may include the same material or different materials.

The organic light-emitting diode 200 may be arranged on the planarization layer 120. The organic light-emitting diode 200 may include a pixel electrode 210, an intermediate layer 220, and an opposite electrode 230. The intermediate layer 220 includes an organic emission layer.

The pixel electrode 210 may be a transparent electrode, a semi-transparent electrode or a reflective electrode. In an embodiment, the pixel electrode 210 may include a reflective layer and a transparent electrode layer or a semi-transparent electrode layer on the reflective layer, the reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent electrode layer or the semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). As an example, the pixel electrode 210 may have a structure of ITO/Ag/ITO.

The pixel electrode 210 may be electrically connected to the first thin-film transistor TFT1 through a contact metal CM.

A pixel-defining layer 125 may be arranged on the planarization layer 120. The pixel-defining layer 125 may prevent an arc, etc. from occurring at the edges of the pixel electrode 210 by increasing a distance between the edges of the pixel electrode 210 and the opposite electrode 230 over the pixel electrode 210.

The pixel-defining layer 125 may include at least one organic insulating material from among polyimide, polyamide, an acryl resin, benzocyclobutene, and a phenolic resin and be formed through spin coating, etc.

The intermediate layer 220 of the organic light-emitting diode 200 may be arranged in an opening OP of the pixel-defining layer 125. An emission area EA of the organic light-emitting diode 200 may be defined by the opening OP.

The intermediate layer 220 may include an organic emission layer. The organic emission layer may include an organic material including a fluorescent or phosphorous material that emits red, green, blue, or white light. The organic emission layer may be a low molecular weight organic material or a polymer organic material. A functional layer may be selectively further arranged under and on the organic emission layer, the functional layer including a hole transport layer (HTL), a hole injection layer (HIL), an electron transport layer (ETL), and an electron injection layer (EIL).

The organic emission layer may correspond to each of the pixel electrodes 210 provided for each pixel P. The intermediate layer 220 on each of the pixel electrodes 201 may be connected to each other to form one body over the plurality of pixel electrodes 210 as well as the organic emission layer. Various modifications may be made to the configuration of the intermediate layer 220.

The opposite electrode 230 may be a transparent electrode or a reflective electrode. In an embodiment, the opposite electrode 230 may be a transparent electrode or a semi-transparent electrode and may include a thin metal layer having a low work function and including Li, Ca, LiF/Ca, LiF/Al, Al, Ag, Mg, or a compound thereof. In addition, a transparent conductive oxide (TCO) layer may be further arranged on the thin metal layer, the TCO layer including ITO, IZO, ZnO, or $In_2O_3$. The opposite electrode 230 may be formed as one body over the entire surface of the display area DA and arranged on the intermediate layer 220 and the pixel-defining layer 125.

A capping layer (not shown) may be arranged on the opposite electrode 230. The capping layer may be configured to protect the opposite electrode 230 and to increase a light extraction efficiency. As an example, the capping layer may include a material having a refractive index of about 1.2 to about 3.1. In addition, the capping layer may include an organic material. The capping layer may be omitted.

Though not shown, a thin-film encapsulation layer (not shown) may be further arranged on the opposite electrode 230, the thin-film encapsulation layer including at least one organic encapsulation layer and at least one inorganic encapsulation layer.

Referring to FIG. 3, the substrate 100 may include the first base layer 110, the first barrier layer 120, the second base layer 130, and the second barrier layer 140 that are sequentially stacked. The buffer layer 111 may be arranged on the second barrier layer 140. The first semiconductor layer A1 may be arranged on the buffer layer 111. In an embodiment, the buffer layer 111 may be omitted.

The first barrier layer 120 may include a first sub-layer 121 and a second sub-layer 122. As shown in FIG. 2, the first sub-layer 121 may be arranged on the first base layer 110. The second sub-layer 122 may be arranged on the first sub-layer 121.

In an embodiment, the first sub-layer 121 may include an inorganic material. The first sub-layer 121 may include, for example, silicon oxide ($SiO_x$), silicon nitride ($SiN_x$), or silicon oxynitride (SiON). The first sub-layer 121 may include the same material as the second barrier layer 140 or include a material different from the second barrier layer 140. As an example, the first sub-layer 121 and the second barrier layer 140 may each include silicon oxide ($SiO_x$).

The second sub-layer 122 may include partially crystallized amorphous silicon. The second sub-layer 122 may be arranged between the first sub-layer 121 and the second base layer 130 to improve adhesion between the first sub-layer 121 and the second base layer 130, the second sub-layer 122 including an inorganic material, and the second base layer 130 including an organic material. Because the second sub-layer 122 is arranged between the first sub-layer 121 and the second base layer 130, the first sub-layer 121 and the second base layer 130 having different properties may be prevented from peeling.

The second sub-layer 122 may have a partially crystallized structure in which crystal of silicon is included in the amorphous silicon (a-Si). The crystallized structure may be randomly arranged in the amorphous silicon (a-Si). This crystallized structure may be formed when a portion of the amorphous silicon (a-Si) is crystallized while the second sub-layer 122 is formed with the amorphous silicon (a-Si). In an embodiment, the crystallized structure may be included at a ratio of about 2% to about 25% (Volume %) of the entire second sub-layer 122.

In an embodiment, a thickness t2 of the second sub-layer 122 may be thinner than a thickness t1 of the first sub-layer 121. As an example, the thickness t1 of the first sub-layer 121 may be about 4000 Å to 7000 Å, and the thickness t2 of the second sub-layer 122 may be about 5 Å to about 100 Å.

The second sub-layer 122 may include a Si-H bond forming amorphous silicon (a-Si). As an example, the ratio of silicon (Si) contained in the second sub-layer 122 may be 90% or more, and the ratio of hydrogen (H) contained in the second sub-layer 122 may be 10% or less. The second sub-layer 122 may have a hydrogen concentration of about 4.0 E+21 atom/$cm^3$ to about 6.0 E+21 atom/$cm^3$.

In addition, the second sub-layer 122 may have a preset surface roughness. The surface, that is, the top surface 122u of the second sub-layer 122 may have surface roughness of about 20 μm to about 500 μm. This surface roughness may be related to the hydrogen concentration. That is, when the hydrogen concentration included in the second sub-layer 122 increases, surface roughness is reduced. In contrast, when the hydrogen concentration included in the second sub-layer 122 is reduced, surface roughness increases. As a comparative example, in the case where the hydrogen concentration included in a second sub-layer is about 3.4 E+21 atom/$cm^3$, surface roughness may be about 1.2 nm. According to an embodiment, in the case where the hydrogen concentration inside the second sub-layer 122 is about 4.8 E+21 atom/cm$^3$, surface roughness may be about 0.5 nm.

The hydrogen concentration of the second sub-layer 122 may be controlled by the amount of a crystallized structure in which a portion of the amorphous silicon (a-Si) is crystallized in the second sub-layer 122. The second sub-layer 122 according to the comparative example may not include a crystallized structure in the amorphous silicon (a-Si).

Figure 4:
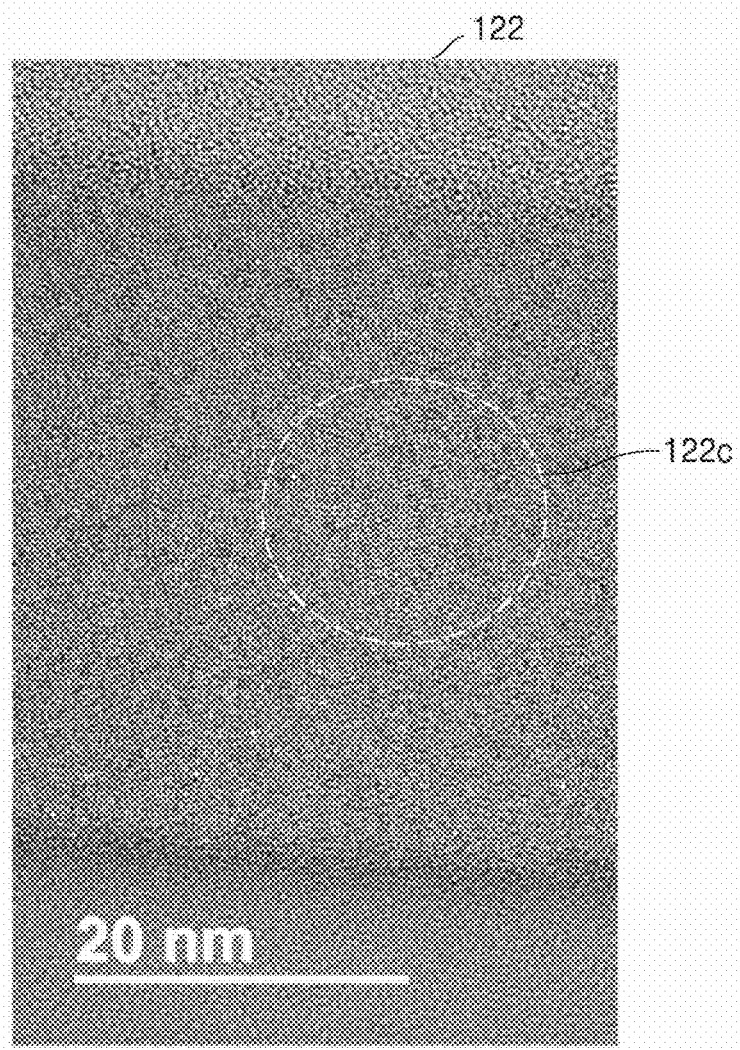
FIG. 4 is a transmission electron microscope (TEM) image of a second sub-layer according to an embodiment.

FIG. 4 is a TEM image of the second sub-layer 122 according to an embodiment.

Referring to FIG. 4, the second sub-layer 122 of the first barrier layer 120 may include a crystallized structure 122c. Referring to an image of FIG. 4, a crystallized structure included in the second sub-layer 122 may have a crystalline structure. The crystallized structure 122c may be arranged along a direction. As shown in FIG. 4, the crystallized structure 122c may be aligned along one direction.

As described above, the crystallized structure 122c may be included at a ratio of about 2% to about 25% (Volume %) of the entire second sub-layer 122. The crystallized structures 122c shown in FIG. 4 may appear in the entire second sub-layer 122.

Figure 5:
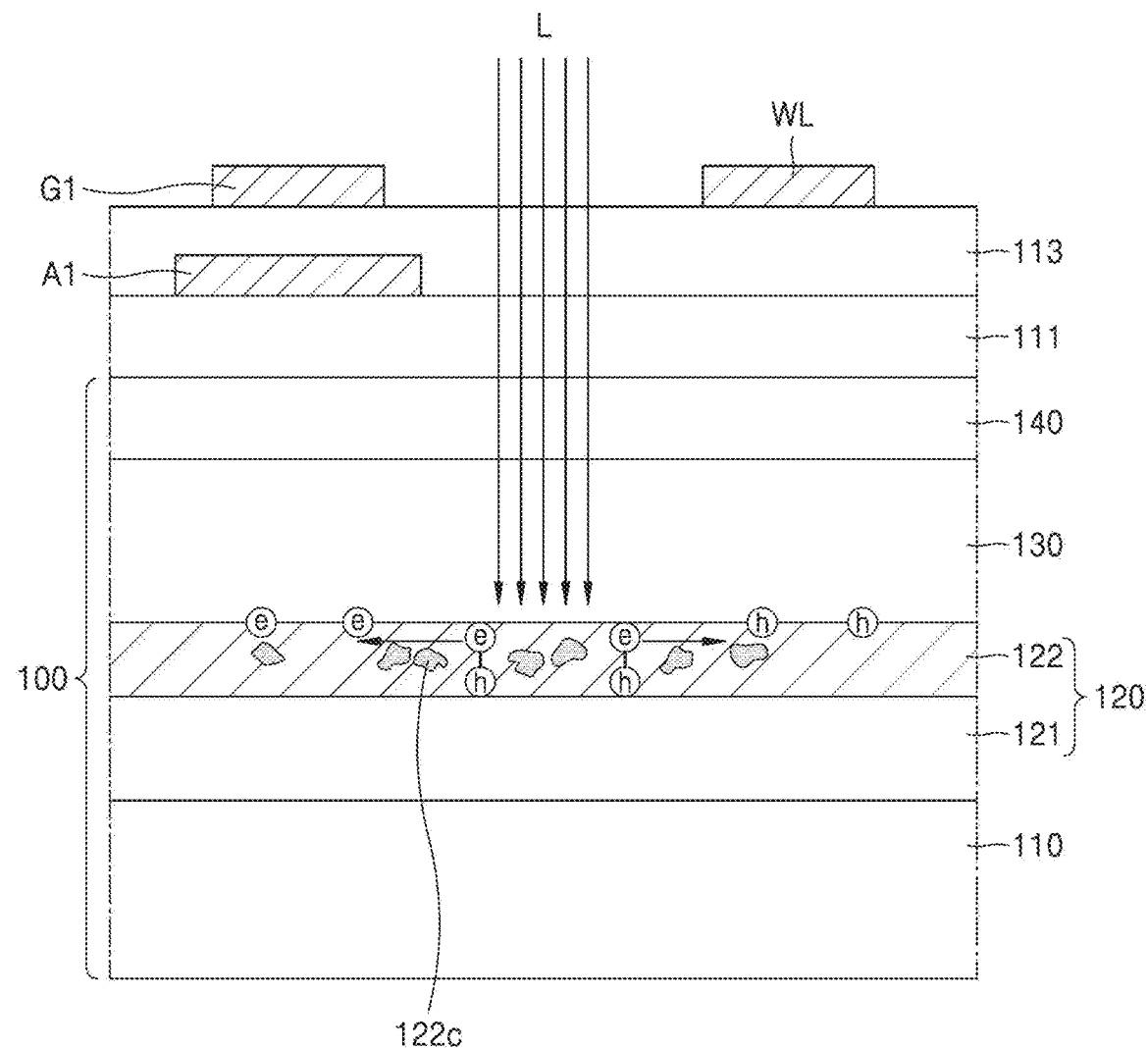
FIG. 5 is a cross-sectional view showing a mechanism of layer characteristic improvement of a second sub-layer according to an embodiment.

FIG. 5 is a cross-sectional view showing a mechanism of a layer characteristic improvement of the second sub-layer 122 according to an embodiment.

Referring to FIG. 5, the display apparatus according to an embodiment may include the second sub-layer 122 between the first sub-layer 121 and the second base layer 130 of the substrate 100, the second sub-layer 122 including silicon crystals randomly distributed in the amorphous silicon (a-Si). Because the second sub-layer 122 includes amorphous silicon (a-Si), in the case where external light L is incident into the second sub-layer 122, an electron-hole pair e-h may be inevitably formed inside the second sub-layer 122. An electron-hole pair e-h is divided according to a voltage difference between conductive layers (e.g., the first gate electrode G1 and a wiring WL) which is applied to a pixel circuit. This may cause polarization inside the second base layer 130, and consequently, may act as a factor changing a driving characteristic of a silicon-based semiconductor, that is, the first semiconductor layer A1.

The display apparatus according to an embodiment may include the crystallized structure 122c in at least a portion of the second sub-layer 122, and thus, reduce dangling bonds inside the second sub-layer 122, thereby reducing or minimizing the forming of an electron-hole pair e-h. Though this, a characteristic of the second sub-layer 122 may be improved, and the characteristic of the first thin-film transistor TFT1 may be prevented from being deteriorated by external light, and thus, reliability of the first thin-film transistor TFT1 may be improved.

Figure 6:
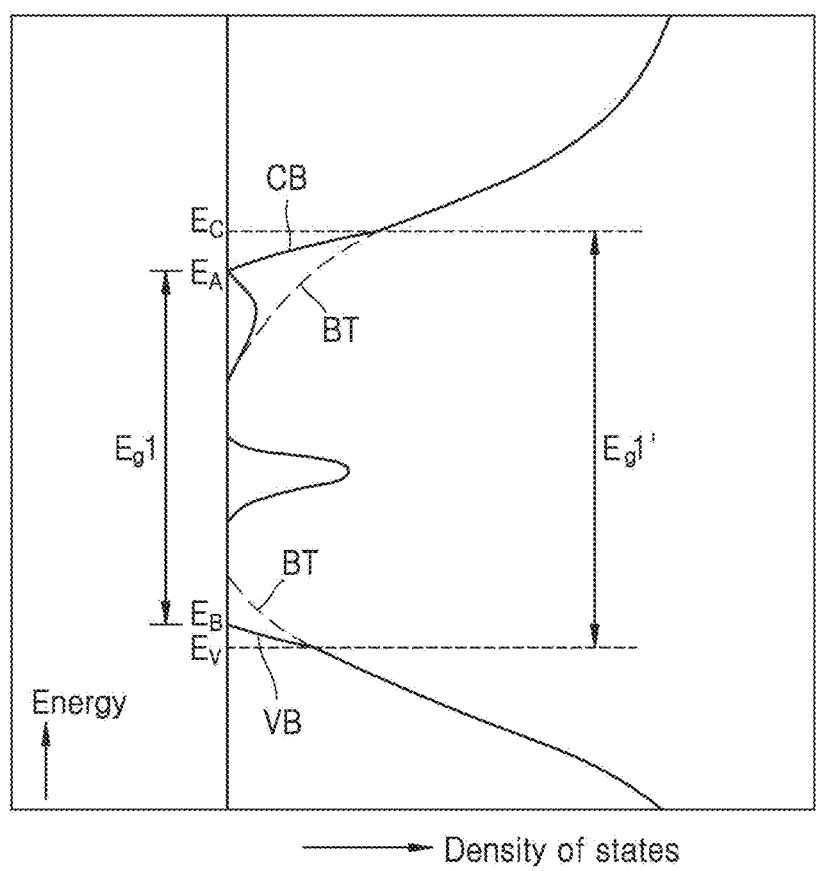
FIG. 6 is a band diagram of an energy level of a second sub-layer according to an embodiment.
Figure 7:
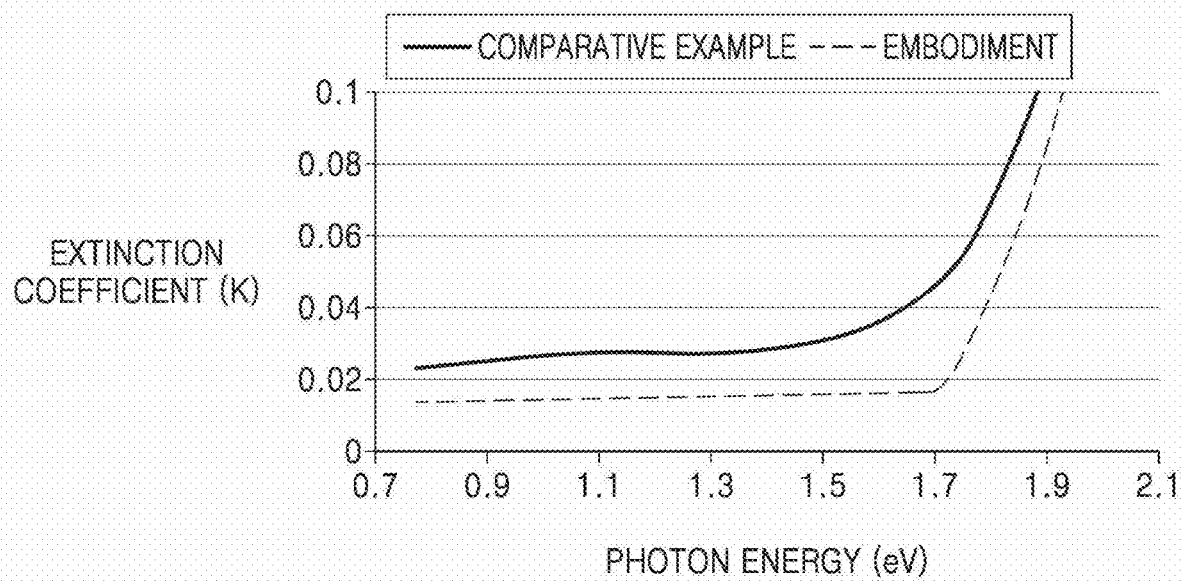
FIG. 7 is a graph of measurement of a band gap of a second sub-layer according to an embodiment and a second sub-layer according to a comparative example.

FIG. 6 is a band diagram of an energy level of the second sub-layer 122 according to an embodiment, and FIG. 7 is a graph of measuring a band gap of the second sub-layer 120 according to an embodiment and a second sub-layer according to a comparative example.

In an embodiment, an extinction coefficient K of the second sub-layer 122 may be about 0.01 to about 0.025. The extinction coefficient K may denote a band tail BT in the band diagram of FIG. 6.

Referring to the above drawings and FIG. 6, the second sub-layer 122 according to an embodiment may have a band gap Eg1. A band gap may denote a regional band in which there is no state of an electron between a conduction band CB and a valance band VB. Layer properties, for example, conductors, semiconductors, and non-conductors, may vary depending on the width of the band gap.

Because the second sub-layer 122 includes a crystallized structure, the band tail BT may be reduced. The band tail BT may denote a degree of hydrogen trapped in amorphous silicon (a-Si). When hydrogen is trapped more, the band tail BT may be longer. As a comparative example, in the case where the second sub-layer does not include a crystallized structure and includes only amorphous silicon (a-Si), a band diagram of the second sub-layer may be formed to follow a band tail BT marked in a dotted line in FIG. 6. As shown, a band gap Eg1' of the second sub-layer according to a comparative example may be greater than a band gap Eg1 of the second sub-layer 122 according to an embodiment.

Because the second sub-layer 122 according to an embodiment includes silicon crystals randomly distributed in amorphous silicon (a-Si), an amount of hydrogen trapped in the amorphous silicon (a-Si) may be reduced, and thus, the band tail BT may be reduced. Thus, the band gap Eg1 may be reduced due to the reduced band tail BT.

Referring to FIG. 7, extinction coefficients K of the second sub-layer 122 according to an embodiment and a second sub-layer according to a comparative example are compared to each other and measured. As described above, the second sub-layer 122 includes silicon crystals randomly distributed in the amorphous silicon (a-Si), and a comparative example includes the amorphous silicon (a-Si) only or does not include the crystallized structure. In a graph of FIG. 7, an x-axis denotes photon energy eV, and a y-axis denotes an extinction coefficient K.

In an embodiment, an extinction coefficient K has been measured to about 0.01 in a photon energy region of about 0.8 eV to about 1.7 eV. In a comparative example, an extinction coefficient K has been measured to about 0.03 in the same photon energy region of about 0.8 eV to about 1.7 eV. Accordingly, referring to the graph of FIG. 7, it is shown that an extinction coefficient K in an embodiment is lower than an extinction coefficient K in a comparative example. When an extinction coefficient is low, it may mean that a band tail and a band gap are reduced. When an extinction coefficient K is low, hydrogen H trapped in the amorphous silicon (a-Si) of the second sub-layer 122 is reduced. Thus, hydrogen concentration included in the second sub-layer 122 may be increased.

The display apparatus according to an embodiment may include the first thin-film transistor TFT1 including a silicon-based semiconductor and the second thin-film transistor TFT2 including an oxide-based semiconductor of the pixel circuit PC as shown in FIG. 2, and thus employ both characteristics of an oxide-based semiconductor having a high carrier mobility and a low leakage current and thus having a small voltage drop even though a driving time is long, and characteristics of a silicon-based semiconductor having high reliability.

In addition, the display apparatus according to an embodiment may include the second sub-layer 122 including the partially crystallized amorphous silicon (a-Si) in the second barrier layer 120 of the substrate 100. In a comparative example, as described above, the second sub-layer improves adhesion between an organic layer and an inorganic layer, but an electron-hole separation in the second sub-layer occurs due to external light incident onto the second sub-layer, which causes polarization in the upper portion of the second base layer, and consequently, may act as a factor that changes driving characteristics of the first thin-film transistor including a silicon-based semiconductor. This generates an afterimage of a pixel due to a reaction speed deviation between pixel circuits and may deteriorate a display quality.

In contrast, the display apparatus according to an embodiment includes a crystallized structure in at least a portion of the second sub-layer 122 to improve characteristics of the second sub-layer 122, and thus, prevents deterioration of the first thin-film transistor TFT1 by external light, thereby improving reliability.

Figure 8:
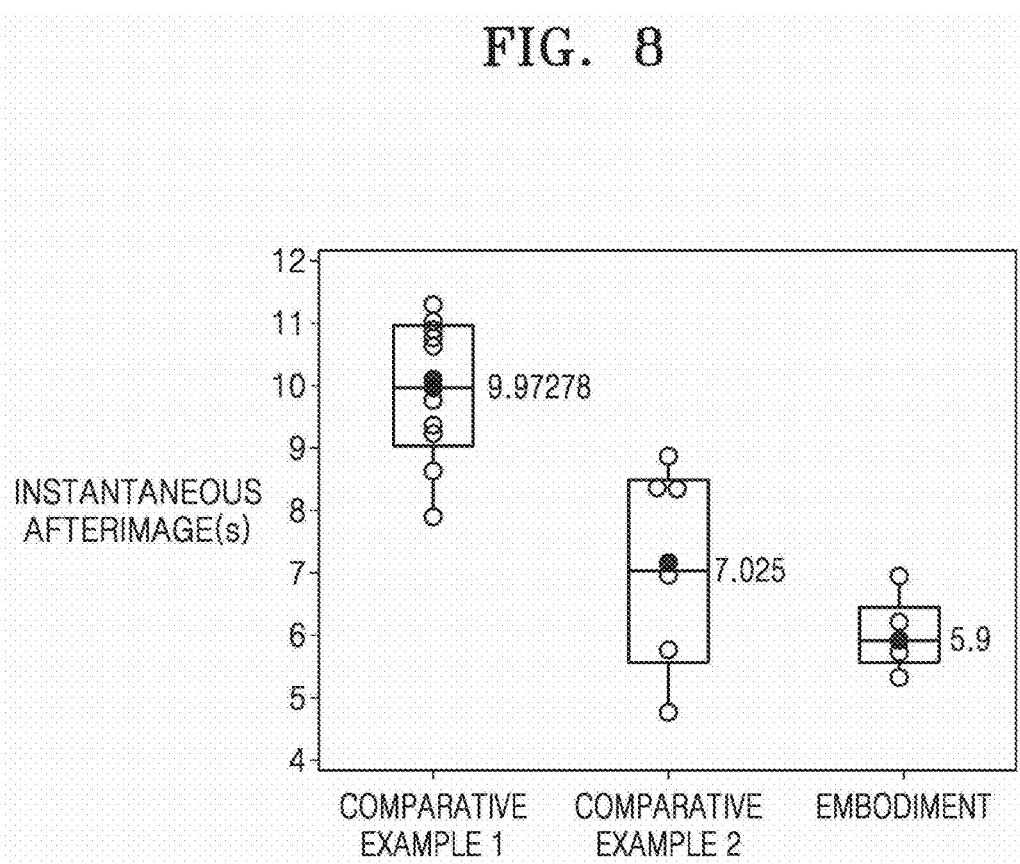
FIG. 8 is a graph showing results obtained by measuring an instantaneous afterimage of a display apparatus according to an embodiment and comparative examples.

FIG. 8 is a graph showing results obtained by measuring an instantaneous afterimage of a display apparatus according to an embodiment and comparative examples.

Referring to FIG. 8, duration of times have been measured at which an instantaneous afterimage is present in comparative example 1, comparative example 2, and an embodiment. In FIG. 8, a deviation of a brightness change has been measured according to time at which brightness is restored after light is emitted in comparative example 1, comparative example 2, and an embodiment. A y-axis denotes time (second, s) for which an instantaneous afterimage continues according to a brightness deviation.

A substrate of comparative example 1 includes a first base layer, a first barrier layer, a second base layer, and a second barrier layer that are sequentially stacked. The first barrier layer has a stacking structure of an inorganic material layer of $SiO_x$ and an amorphous silicon layer. In comparative example 1, the amorphous silicon layer does not include a crystallized structure. A substrate of comparative example 2 includes a first base layer, a first barrier layer, a second base layer, and a second barrier layer that are sequentially stacked. The first barrier layer includes $SiO_x$ and does not include an amorphous silicon layer. As shown in FIG. 2, an embodiment includes a first base layer, a first barrier layer, a second base layer, and a second barrier layer that are sequentially stacked. The first barrier layer includes a stacking structure of a first sub-layer and a second sub-layer, the first sub-layer including SiOx, and the second sub-layer including a partially crystallized amorphous silicon. The second sub-layer according to an embodiment has silicon crystals randomly distributed in the amorphous silicon.

As shown in FIG. 8, an instantaneous afterimage continued for about 9.97 second in comparative example 1, and an instantaneous afterimage continued for about 7.025 second in comparative example 2. In contrast, in an embodiment, an instantaneous afterimage continued for about 5.9 second, which reveals that an instantaneous afterimage due to a brightness deviation in the embodiment has been remarkably reduced compared to comparative example 1 and comparative example 2.

Figure 9:
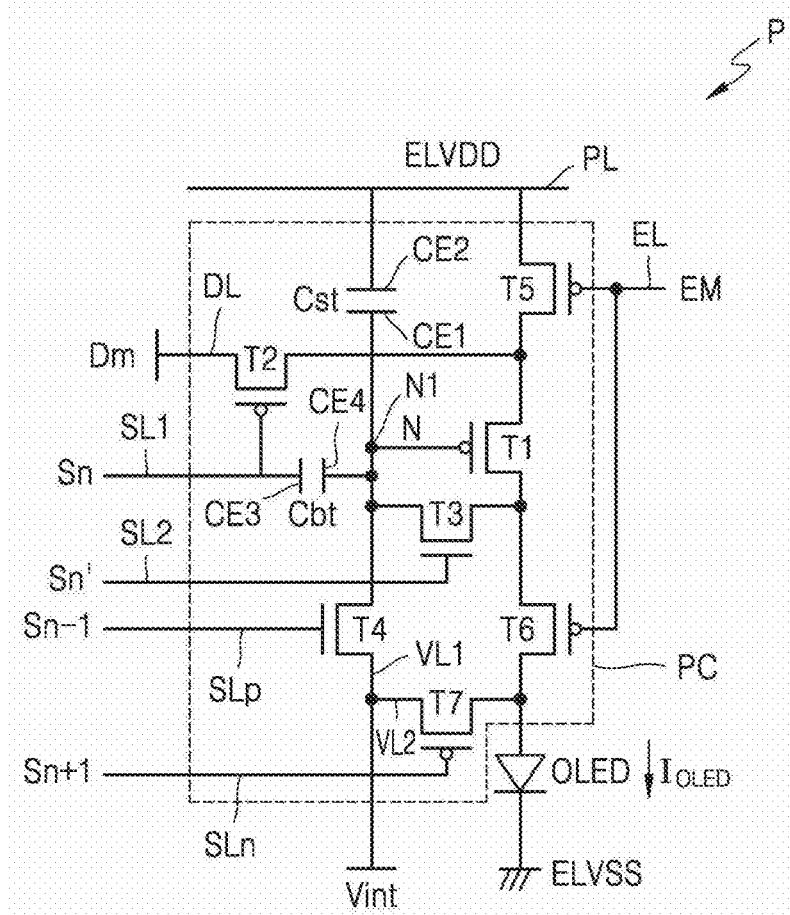
FIG. 9 is an equivalent circuit diagram of an organic light-emitting diode of a display apparatus and a pixel circuit connected thereto according to an embodiment.

FIG. 9 is an equivalent circuit diagram of the organic light-emitting diode OLED of the display apparatus and the pixel circuit PC connected thereto according to an embodiment.

Referring to FIG. 9, the pixel circuit PC connected to the organic light-emitting diode OLED may include a plurality of transistors and capacitors. The pixel circuit PC may include the first to seventh transistors T1, T2, T3, T4, T5, T6, and T7, the storage capacitor Cst, and a boost capacitor Cbt.

Some of the first to seventh transistors T1, T2, T3, T4, T5, T6, and T7 may be n-channel metal oxide semiconductor field-effect transistors (NMOSFET), and the rest of the first to seventh transistors T1, T2, T3, T4, T5, T6, and T7 may be p-channel metal oxide semiconductor field-effect transistors (PMOS). As an example, the third transistor T3 and the fourth transistor T4 may be NMOSFET, and the rest may be PMOSFET. In another embodiment, the third transistor T3, the fourth transistor T4, and the seventh transistor T7 may be NMOSFET, and the rest may be PMOSFET. Alternatively, only one of the first to seventh transistors T1, T2, T3, T4, T5, T6, and T7 may be an NMOSFET, and the rest may be PMOSFET.

The first to seventh transistors T1, T2, T3, T4, T5, T6, and T7, the storage capacitor Cst, and the boost capacitor Cbt may be connected to a signal line.

Signal lines may include a first scan line SL1, a second scan line SL2, a previous scan line SLp, an emission control line EL, a next scan line SLn and a data line DL, the first scan line SL1 transferring a first scan signal Sn, the second scan line SL2 transferring a second signal Sn', the previous scan line SLp transferring a previous scan signal Sn−1, the emission control line EL transferring an emission control signal En, the next scan line SLn transferring a next scan signal Sn+1, and the data line DL crossing the first scan line SL1 and transferring a data signal Dm.

A driving voltage line PL transfers a driving voltage ELVDD to the first transistor T1. First and second initialization voltage lines VL1 and VL2 may transfer an initialization voltage Vint.

The first transistor T1 may be a driving transistor. A first gate electrode (or a first control electrode) of the first transistor T1 (also referred to as a driving transistor) may be connected to the storage capacitor Cst, a first electrode of the driving transistor T1 is electrically connected to the driving voltage line PL through the fifth transistor T5, and a second electrode of the first transistor T1 may be electrically connected to a pixel electrode of the organic light-emitting diode OLED through the sixth transistor T6. One of the first electrode and the second electrode of the first transistor T1 may be a source electrode, and the other may be a drain electrode. The first transistor T1 may receive a data signal Dm according to a switching operation of the second transistor T2 and supply a driving current Id to the organic light-emitting diode OLED.

The second transistor T2 may be a switching transistor. A second gate electrode (or a second control electrode) of the second transistor T2 is connected to the first scan line SL1, a first electrode of the second transistor T2 is connected to the data line DL, and a second electrode of the second transistor T2 is connected to the first electrode of the driving transistor T1 and electrically connected to the driving voltage line PL through the fifth transistor T5. One of the first electrode and the second electrode of the second transistor T2 may be a source electrode, and the other may be a drain electrode. The second transistor T2 may be turned on according to a first scan signal Sn transferred through the first scan line SL1 and be configured to perform a switching operation of transferring a data signal Dm received from the data line DL to the first electrode of the first transistor T1.

The third transistor T3 may be a compensation transistor that compensates for a threshold voltage of the first transistor T1. A third gate electrode (or a compensation control electrode) of the third transistor T3 is connected to the second scan line SL2. A first electrode of the third transistor T3 is connected to the first electrode CE1 of the storage capacitor Cst and the first gate electrode of the first transistor T1 through a node connection line N. The first electrode of the third transistor T3 may be connected to the fourth transistor T4. A second electrode of the third transistor T3 is connected to the second electrode of the first transistor T1 and electrically connected to the pixel electrode of the organic light-emitting diode OLED through the sixth transistor T6. One of the first electrode and the second electrode of the third transistor T3 may be a source electrode, and the other may be a drain electrode.

The third transistor T3 is turned on according to a second scan signal Sn' transferred through the second scan line SL2, and diode-connects the first transistor T1 by electrically connecting the first gate electrode to the second electrode of the first transistor T1.

The fourth transistor T4 may be a first initialization transistor that initializes the first gate electrode of the first transistor T1. A fourth gate electrode (or a fourth control electrode) of the fourth transistor T4 is connected to the previous scan line SLp. A first electrode of the fourth transistor T4 is connected to the first initialization voltage line VL1. A second electrode of the fourth transistor T4 may be connected to the first electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 may be turned on according to a previous scan signal Sn−1 received from the previous scan line SLp and may transfer the initialization voltage Vint to the first gate electrode of the first transistor T1, thereby performing an operation of initializing the voltage of the first gate electrode of the first transistor T1.

The fifth transistor T5 may be an operation control transistor. A fifth gate electrode (or a fifth control electrode) of the fifth transistor T5 is connected to the emission control line EL, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may be an emission control transistor. A sixth gate electrode (or a sixth control electrode) of the sixth transistor T6 is connected to the emission control line EL, a first electrode of the sixth transistor T6 is connected to the second electrode of the first transistor T1 and the second electrode of the third transistor T3, and a second electrode of the sixth transistor T6 is electrically connected to the second electrode of the seventh transistor T7 and the pixel electrode of the organic light-emitting diode OLED. One of the first electrode and the second electrode of the sixth transistor T6 may be a source electrode, and the other may be a drain electrode.

The fifth transistor T5 and the sixth transistor T6 may be simultaneously turned on according to an emission control signal En received from the emission control line EL, and the driving voltage ELVDD may be transferred to the organic light-emitting diode OLED to allow the driving current Id to flow through the organic light-emitting diode OLED.

The seventh transistor T7 may be a second initialization transistor that initializes the pixel electrode of the organic light-emitting diode OLED. A seventh gate electrode (or a seventh control electrode) of the seventh transistor T7 is connected to the next scan line SLn. A first electrode of the seventh transistor T7 is connected to the second initialization voltage line VL2. A second electrode of the seventh transistor T7 is connected to the second electrode of the sixth transistor T6 and the pixel electrode of the organic light-emitting diode OLED. The seventh transistor T7 may be turned on according to a next scan signal Sn+1 received from the next scan line SLn to initialize the pixel electrode of the organic light-emitting diode OLED. Though it is shown in FIG. 9 that the seventh gate electrode of the seventh transistor T7 is connected to the next scan line SLn, the seventh transistor T7 may be connected to the emission control line EL and driven according to an emission control signal En. In this case, as an example, the fifth transistor T5 and the sixth transistor T6 may be PMOS and the seventh transistor T7 may be NMOS.

The storage capacitor Cst includes the first electrode CE1 and the second electrode CE2. The first electrode CE1 of the storage capacitor Cst is connected to the first electrode of the first transistor T1 and the second electrode CE2 of the storage capacitor Cst is connected to the driving voltage line PL. The storage capacitor Cst may store a charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the first scan line SL1. The fourth electrode CE4 may be connected to the first electrode of the third transistor T3 and the node connection line N. The boost capacitor Cbt may raise the voltage of a first node N1 when a first scan signal Sn supplied to the first scan line SL1 is turned off. When the voltage of the first node N1 is raised, a black grayscale may be clearly expressed.

The first node N1 may be a region to which the first gate electrode of the first transistor T1, the first electrode of the third transistor T3, the second electrode of the fourth transistor T4, and the fourth electrode CE4 of the boost capacitor Cbt are connected.

In an embodiment, FIG. 9 describes that the third and fourth transistors T3 and T4 are NMOSFET, and the first to second transistors and the fifth to seventh transistors T1, T2, T5, T6, and T7 are PMOSFET. The first transistor T1 having a direct influence on the brightness of the display apparatus is configured to include a semiconductor layer including polycrystalline silicon having high reliability. Through this, a high-resolution display apparatus may be implemented.

Because an oxide-based semiconductor has high carrier mobility and a low leakage current, a voltage drop is not large even though a driving time is long. That is, because a color change of an image due to a voltage drop is not large even when the display apparatus is driven at low frequencies, low frequency driving may be implemented. Because the oxide-based semiconductor has an advantage of a small leakage current, oxide-based semiconductors are employed as the third transistor T3 and/or the fourth transistor T4 connected to the first gate electrode of the first transistor T1, and thus, a voltage change of the first gate electrode G1 due to a leakage current through the third transistor T3 and/or the fourth transistor T4 may be prevented, and simultaneously, power consumption may be reduced. In another embodiment, the third transistor T3, the fourth transistor T4, and/or the seventh transistor T7 may be oxide transistors including an oxide-based semiconductor.

Figure 10:
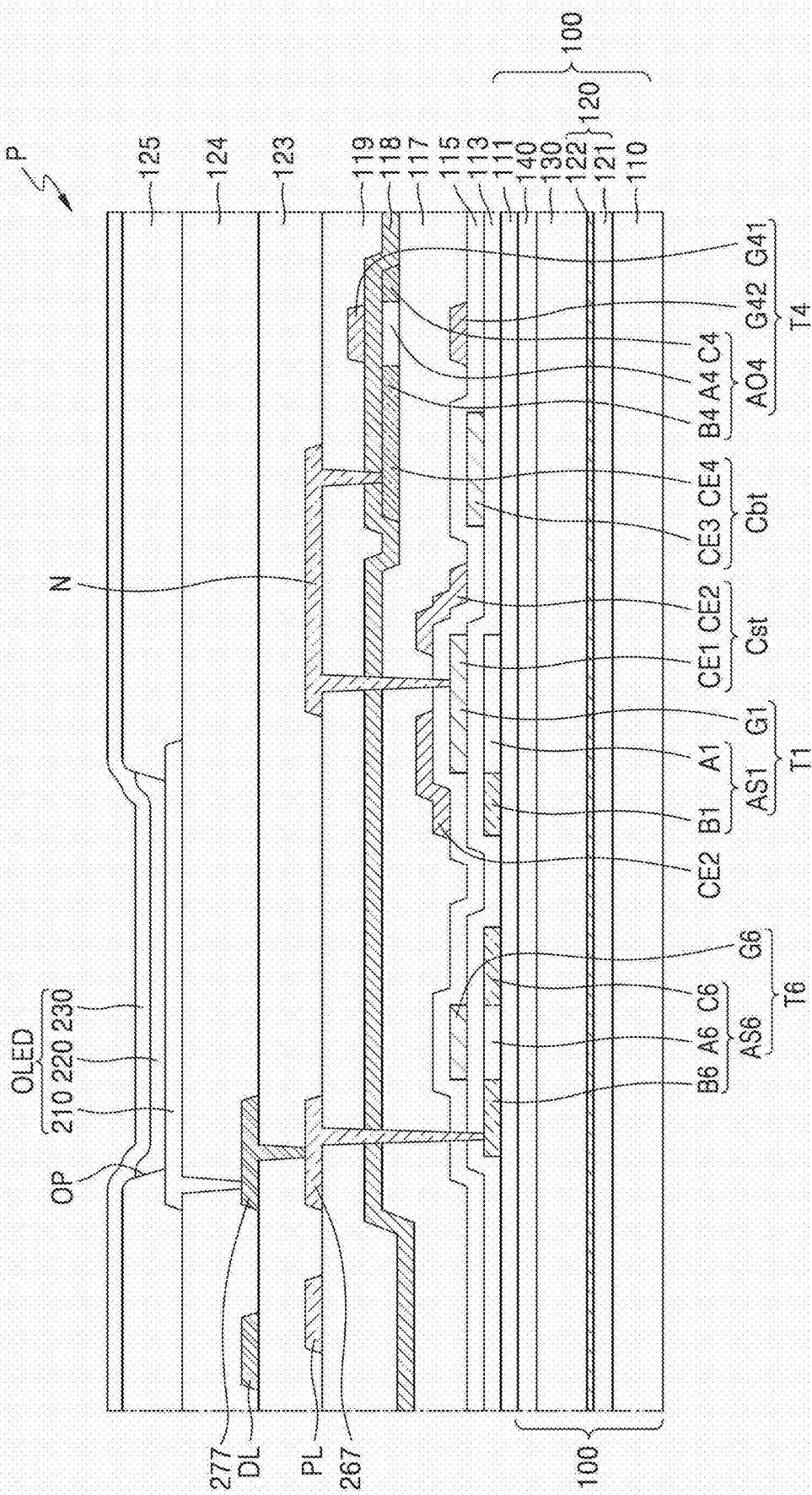
FIG. 10 is a cross-sectional view of a display apparatus according to an embodiment.

FIG. 10 is a cross-sectional view of a display apparatus according to an embodiment.

FIG. 10 shows a cross-sectional view of a portion of the display apparatus and shows a portion of elements included in the pixel circuit PC of FIG. 9. FIG. 10 shows the first transistor T1 and the sixth transistor T6 each including a silicon semiconductor, the fourth transistor T4 including an oxide semiconductor, a first capacitor Cst and a second capacitor Cbt.

The buffer layer 111 disposed on the substrate 100 may increase flatness of the top surface of the substrate 100 and include an inorganic insulating material such as silicon oxide, silicon nitride, and silicon oxynitride.

A first semiconductor layer AS1 of the first transistor T1 and a sixth semiconductor layer AS6 of the sixth transistor T6 each including a silicon semiconductor may be arranged on the buffer layer 111. In an embodiment, FIG. 10 shows a first highly doped impurity region B1 having conductivity and a channel region A1 of the first semiconductor layer AS1 and shows a first highly doped impurity region B6 and a second highly doped impurity region C6 having conductivity and a channel region A6 of a sixth semiconductor layer AS6.

The first gate electrode G1 of the first transistor T1 and the sixth gate electrode G6 of the sixth transistor T6 may be respectively arranged over the first semiconductor layer AS1 and the sixth semiconductor layer AS6. The first gate insulating layer 113 may be arranged between the first semiconductor layer AS1 and the first gate electrode G1 and between the sixth semiconductor layer AS6 and the sixth gate electrode G6.

The first gate insulating layer 113 may include an inorganic material including an oxide or a nitride. As an example, the first gate insulating layer 113 may include at least one of silicon oxide, silicon nitride, silicon oxynitride, aluminum oxide, titanium oxide, tantalum oxide, and hafnium oxide.

The first gate electrode G1 may overlap the channel region A1 of the first semiconductor layer AS1 and the sixth gate electrode G6 may overlap the channel region A6 of the sixth semiconductor layer AS6. The first gate electrode G1 and the sixth gate electrode G6 may include at least one of molybdenum (Mo), copper (Cu), and titanium (Ti), and include a single layer or a multi-layer including the above materials.

The first electrode CE1 of the first capacitor Cst and the third electrode CE3 of the second capacitor Cbt may be arranged on the same layer as the first gate electrode G1 and the sixth gate electrode G6. The first electrode CE1 of the first capacitor Cst and the third electrode CE3 of the second capacitor Cbt may include the same material as the first gate electrode G1 and the sixth gate electrode G6.

The second gate insulating layer 115 may be arranged on the first gate electrode G1 and the sixth gate electrode G6. The second gate insulating layer 115 may include an inorganic material including an oxide or a nitride. As an example, the second gate insulating layer 115 may include at least one of silicon oxide, silicon nitride, silicon oxynitride, aluminum oxide, titanium oxide, tantalum oxide, and hafnium oxide.

The second electrode CE2 of the first capacitor Cst may be arranged on the second gate insulating layer 115 to overlap the first electrode CE1 of the first capacitor Cst. A second gate electrode G42 of the fourth transistor T4 may be arranged on the second gate insulating layer 115. The second electrode CE2 and the second gate electrode G42 of the fourth transistor T4 may include at least one of molybdenum (Mo), copper (Cu), and titanium (Ti), and include a single layer or a multi-layer including the above materials.

The first interlayer insulating layer 117 may be arranged on the second electrode CE2 of the first capacitor Cst and the second gate electrode G42 of the fourth transistor T4. The first interlayer insulating layer 117 may include an inorganic material including an oxide or a nitride. As an example, the first interlayer insulating layer 117 may include at least one of silicon oxide, silicon nitride, silicon oxynitride, aluminum oxide, titanium oxide, tantalum oxide, and hafnium oxide.

The first capacitor Cst may overlap the first transistor T1. As an example, the first gate electrode G1 of the first transistor T1 may serve as the first electrode CE1 of the first capacitor Cst.

A fourth semiconductor layer AO4 of the fourth transistor T4 including an oxide semiconductor may be arranged on the first interlayer insulating layer 117 to overlap the second gate electrode G42 of the fourth transistor T4. The fourth semiconductor layer AO4 may include a first conductive region B4, a second conductive region C4, and a channel region A4 disposed therebetween, the first conductive region B4 and the second conductive region C4 having conductivity and being spaced apart from each other. The fourth semiconductor layer AO4 may include at least one of a Zn-oxide, an In—Zn oxide, and a Ga—In—Zn oxide.

The fourth transistor T4 may include a double gate electrode. As an example, a first gate electrode G41 may be arranged over the fourth semiconductor layer AO4 of the fourth transistor T4 and the second gate electrode G42 may be arranged below the fourth semiconductor layer AO4. The first gate electrode G41 and the second gate electrode G42 may overlap the channel region A4 of the fourth semiconductor layer AO4.

The third interlayer insulating layer 118 may include an inorganic material including an oxide or a nitride. As an example, the third interlayer insulating layer 118 may include at least one of silicon oxide, silicon nitride, silicon oxynitride, aluminum oxide, titanium oxide, tantalum oxide, and hafnium oxide.

The first gate electrode G41 and the second gate electrode G42 may include at least one of molybdenum (Mo), copper (Cu), and titanium (Ti), and include a single layer or a multi-layer including the above materials.

The second interlayer insulating layer 119 may cover the fourth transistor T4. The driving voltage line PL and a first connection electrode 267 may be arranged on the second interlayer insulating layer 119. The second interlayer insulating layer 119 may include an inorganic material including an oxide or a nitride. As an example, the second interlayer insulating layer 119 may include at least one of silicon oxide, silicon nitride, silicon oxynitride, aluminum oxide, titanium oxide, tantalum oxide, and hafnium oxide.

The driving voltage line PL and the first connection electrode 267 may each include a material having a relatively high conductivity. The driving voltage line PL and the first connection electrode 267 may include at least one of aluminum (Al), copper (Cu), and titanium (Ti) and include a single layer or a multi-layer including the above materials. In an embodiment, the driving voltage line PL and the first connection electrode 267 may have a triple stacking structure of Ti/Al/Ti in which titanium, aluminum, and titanium are sequentially arranged. The first connection electrode 267 may be connected to the sixth semiconductor layer AS6 through a contact hole.

A first planarization layer 123 may be arranged on the driving voltage line PL and the first connection electrode 267. The first planarization layer 123 may include an organic material such as benzocyclobutene (BCB), polyimide, or hexamethyldisiloxane (HMDSO). Alternatively, the first planarization layer 123 may include an inorganic material. The first planarization layer 123 serves as a protective layer covering the first transistor T1, the sixth transistor T6, and the fourth transistor T4. A top surface of the first planarization layer 123 may be flat. The first planarization layer 123 may include a single layer or a multi-layer.

The data line DL and a second connection electrode 277 may be arranged on the first planarization layer 123. The data line DL may overlap the driving voltage line PL. The second connection electrode 277 may be connected to the first connection electrode 267 through a contact hole defined in the first planarization layer 123. The data line DL and the second connection electrode 277 may each include a conductive material such as metal and a conductive oxide. As an example, the data line DL and the second connection electrode 277 may include at least one of aluminum (Al), copper (Cu), and titanium (Ti) and include a single layer or a multi-layer including the above materials. In an embodiment, the data line DL and the second connection electrode 277 may have a triple stacking structure of Ti/Al/Ti in which titanium, aluminum, and titanium are sequentially arranged. A second planarization layer 124 may be arranged on the data line DL and the second connection electrode 277.

The organic light-emitting diode OLED may be arranged on the second planarization layer 124. The organic light-emitting diode OLED may include the pixel electrode 210, the opposite electrode 230, and the intermediate layer 220, the intermediate layer 220 being arranged between the pixel electrode 210 and the opposite electrode 230 and including an emission layer.

The pixel electrode 210 may be connected to the second connection electrode 277 through a contact hole defined in the second planarization layer 124 and be connected to the sixth transistor T6 via the second connection electrode 277 and the first connection electrode 267.

A pixel-defining layer 125 may be arranged on the second planarization layer 124 on the pixel electrode 210. Because the pixel-defining layer 125 and the organic light-emitting diode OLED are the same as those of FIG. 2, repeated descriptions thereof are omitted.

Figure 11:
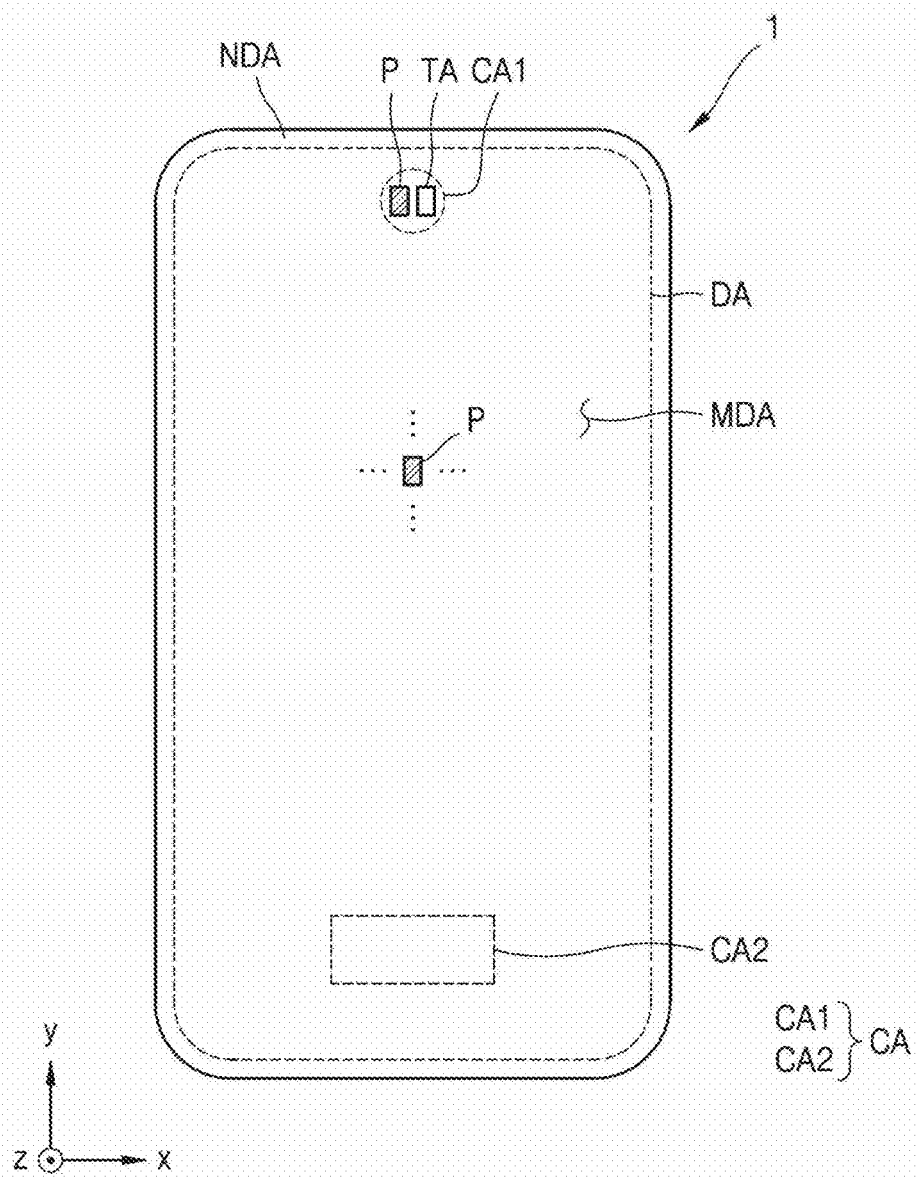
FIG. 11 is a plan view of a display apparatus in which a substrate structure according to an embodiment may be employed.
Figure 12:
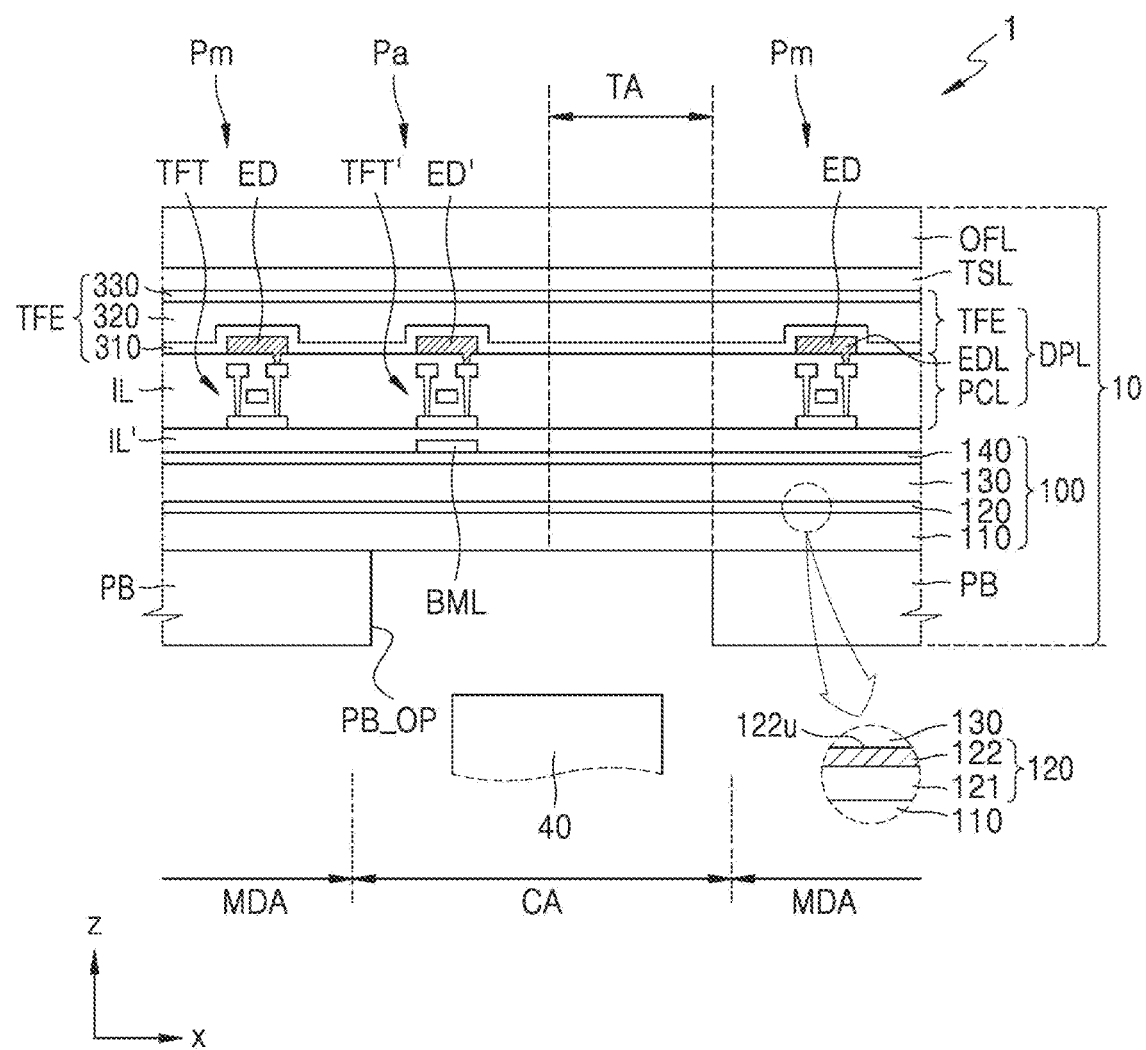
FIG. 12 is a cross-sectional view of a portion of a display apparatus of FIG. 11.

FIG. 11 is a plan view of the display apparatus 1 to which a substrate structure according to an embodiment may be employed and FIG. 12 is a cross-sectional view of a portion of the display apparatus 1 of FIG. 11.

Referring to FIG. 11, the display apparatus 1 includes the display area DA and the peripheral area NDA, the display area DA displaying an image, and the peripheral area NDA not displaying an image. The display area DA includes a main display area MDA and a component area CA. The main display area MDA and the component area CA may display images independently or the main display area MDA and the component area CA may display an image together. A component, which is an electronic element, may be arranged below the component area CA.

The component is a camera that uses an infrared ray or a visible ray and may include a photographing element. Alternatively, the component may be a solar battery, a flash, an illuminance sensor, a proximity sensor, an iris sensor, or a fingerprint sensor. Alternatively, the component may have a function of receiving sound. To prevent the function of the component from being limited, the component area CA may include transmission areas TA through which light and/or sound output from the component may travel to outside or may receive the light and/or sound from the outside.

In an embodiment, the component area CA may be an area having a light transmittance and/or a sound transmittance higher than that of the main display area MDA. In an embodiment, in the case where light passes through the component area CA, a light transmittance may be 10% or more, more preferably, 25% or more, 30% or more, 50% or more, 75% or more, 80% or more, 85% or more, or 90% or more.

At least a portion of the component area CA may be surrounded by the main display area MDA. In addition, the component area CA may be provided in a single or in a plurality. It is shown in FIG. 11 that the component area CA includes a first component area CA1 and a second component area CA2. In the case where the component area CA is provided in a plurality, the component areas CA may have the same shape or different shapes. In an embodiment, the first component area CA1 may be circular and the second component area CA2 may be quadrangular. The plurality of component areas, that is, the first component area CA1 and the second component area CA2 may have different functions. In an embodiment, a camera may be arranged in the first component area CA1, and a fingerprint sensor may be arranged in the second component area CA2.

Referring to FIG. 12, the display apparatus 1 may include the display panel 10 and the component 40 overlapping the display panel 10. A cover window (not shown) may be further arranged on the display panel 10, the cover window protecting the display panel 10.

The display panel 10 may include the substrate 100, a display panel DPL, a touchscreen layer TSL, an optical functional layer OFL on the substrate 100, and a panel-protecting layer PB under the substrate 100. Because the structure of the substrate 100 of FIG. 12 is the same as that of FIG. 3, the description of FIG. 3 is employed.

The display area DA of the display panel 10 includes the component area CA and the main display area MDA, the component area CA overlapping the component 40, and the main display area MDA displaying a main image. The component area CA of FIG. 12 may be the first component area CA1 or the second component area CA2 of FIG. 11.

The display layer DPL may include a circuit layer PCL, a display element layer EDL, and an encapsulation layer, the circuit layer PCL including thin-film transistors, that is, main and auxiliary thin-film transistors TFT and TFT', the display element layer EDL including light-emitting elements, that is, main and auxiliary light-emitting elements ED and ED', which are display elements, and the encapsulation layer including a thin-film encapsulation layer TFE or an encapsulation substrate (not shown). Insulating layers IL and IL' may be arranged between the substrate 100 and the display layer DPL and inside the display layer DPL.

A main sub-pixel Pm and the main thin-film transistor TFT connected thereto may be arranged in the main display area MDA of the display panel 10, the main sub-pixel Pm including the main light-emitting element ED. An auxiliary sub-pixel Pa and the auxiliary thin-film transistor TFT' connected thereto may be arranged in the component area CA, the auxiliary sub-pixel Pa including the auxiliary light-emitting element ED'.

In addition, the transmission area TA may be arranged in the component area CA, a display element not being arranged in the transmission area TA. The transmission area TA may be an area through which light/a signal emitted from the component 40 corresponding to the component area CA or light/a signal incident to the component 40 may pass.

The bottom metal layer BML may be arranged in the component area CA. The bottom metal layer BML may be arranged to correspond to the auxiliary thin-film transistor TFT'. As an example, the bottom metal layer BML may be disposed between the auxiliary thin-film transistor TFT' and the substrate 100. The bottom metal layer BML may block external light reaching the auxiliary thin-film transistor TFT'. In an embodiment, a constant voltage or a signal may be applied to the bottom metal layer BML.

The display element layer EDL may be covered by the thin-film encapsulation layer TFE or the encapsulation substrate. In an embodiment, the thin-film encapsulation layer TFE may include at least one inorganic encapsulation layer and at least one organic encapsulation layer. In an embodiment, the thin-film encapsulation layer TFE may include a first inorganic encapsulation layer 310 and a second inorganic encapsulation layer 330, and an organic encapsulation layer 320 disposed therebetween.

The touchscreen layer TSL may obtain coordinate information corresponding to an external input, for example, a touch event. The touchscreen layer TSL may include a touch electrode and touch wirings connected to the touch electrode. The touchscreen layer TSL may sense an external input through a self-capacitive method or a mutual capacitive method.

The touchscreen layer TSL may be formed on the thin-film encapsulation layer TFE. In an embodiment, the touchscreen layer TSL may be separately formed on a touch substrate and then attached to the thin-film encapsulation layer TFE through an adhesive layer such as an optically clear adhesive. In an embodiment, the touchscreen layer TSL may be directly formed on the thin-film encapsulation layer TFE. In this case, the adhesive layer may not be arranged between the touchscreen layer TSL and the thin-film encapsulation layer TFE.

The optical functional layer OFL may include an anti-reflection layer. The anti-reflection layer may reduce the reflectivity of light incident onto the display apparatus 1 from the outside. As an example, the optical functional layer OFL may be a polarizing film.

In another embodiment, the optical functional layer OFL may be implemented by a filter plate including a black matrix and color filters. The display apparatus including the optical functional layer including the color filters and the black matrix may have a remarkably reduced thickness compared to a display apparatus including a polarizing plate.

The panel-protecting layer PB may be attached under the substrate 100 to support and protect the substrate 100. The panel-protecting layer PB may include an opening PB_OP corresponding to the component area CA. Because the panel-protecting layer PB includes an opening PB_OP, a light transmittance of the component area CA may be improved. The panel-protecting layer PB may include polyethylene terephthalate (PET) or polyimide (PI). Alternatively, the panel-protecting layer PB may include an organic material layer and a metal layer and/or a cushion layer bonded thereto.

The area of the component area CA may be greater than an area in which the component 40 is arranged. Accordingly, the area of the opening PB_OP of the panel-protecting layer PB may not coincide with the area of the component area CA.

As described above, to increase sensing efficiency of the component 40 corresponding to the component area CA, the opening PB_OP which is a portion removed from the panel-protecting layer PB may be provided. A light transmittance may be improved by the opening PB_OP. However, in the component area CA which is directly influenced by external light and a neighboring area, the efficiency of some thin-film transistors inside the pixel circuit PC may be deteriorated or element characteristics may be changed by incidence of external light. Thin-film transistors of a silicon-based semiconductor that does not have the bottom metal layer BML as in FIG. 2 may be even more vulnerable to the influence of external light.

In contrast, the display apparatus according to an embodiment includes a crystallized structure in at least a portion of the second sub-layer 122, thereby improving characteristics of the second sub-layer 122 and preventing characteristics of the thin-film transistor from being deteriorated by external light. Accordingly, reliability may be improved.

Though description has been mainly made to the display apparatus, the embodiment is not limited thereto. As an example, a method of manufacturing the display apparatus also falls within the scope of the present disclosure.

The method of manufacturing the display apparatus according to an embodiment is described with reference to FIGS. 1 to 12.

The display apparatus according to an embodiment may include layers sequentially stacked in a (+) z-direction as in the cross-sectional view shown in FIG. 2 or 10.

A method of forming the substrate 100 may include forming the first base layer 110 on a support substrate (not shown), forming the first barrier layer 120 on the first base layer 110, forming the second base layer 130 on the first barrier layer 120, and forming the second barrier layer 140 on the second base layer 130. The first base layer 110 may be formed by coating an organic material on the support substrate. Depending on the case, to facilitate detachment of the first base layer 110, a sacrificial layer is formed on the support substrate, and then the first base layer 110 may be formed on the sacrificial layer.

Then, the first barrier layer 120 may be formed on the first base layer 110. The forming of the first barrier layer 120 may include forming the first sub-layer 121 on the first base layer 110 and then forming the second sub-layer 122 on the first sub-layer 121. The first sub-layer 121 may include an inorganic material and include, for example, at least one of silicon oxide ($SiO_x$), silicon nitride ($SiN_x$), and silicon oxynitride (SiON).

The second sub-layer 122 may be formed on the first sub-layer 121. In an embodiment, the first sub-layer 121 and the second sub-layer 122 may be formed through chemical vapor deposition and methods are not limited thereto. The second sub-layer 122 may include amorphous silicon (a-Si) in which silicon crystals are randomly distributed. The crystallized structure may be formed by controlling a process condition during a process of forming the second sub-layer 122. Accordingly, a separate process such as ELA is not required to form a crystallized structure, and thus, a manufacturing method may be simplified.

When depositing the second sub-layer 122, power may be about 2100 W to about 2800 W. To form the second sub-layer 122 including crystallized silicon in the second sub-layer 122, a power higher than a power forming an amorphous silicon (a-Si) layer is required. This may facilitate dissociation of a reaction gas (e.g., $SiH_4$), and simultaneously, lower a speed at which the second sub-layer 122 is formed, and thus, a crystallized structure may be formed.

During a process of forming the second sub-layer 122, a first reaction gas and a second reaction gas may be used. In an embodiment, the first reaction gas may be an inert gas such as argon (Ar), and the second reaction gas may be silane ($SiH_4$).

In an embodiment, a fraction of the first reaction gas relative to the second reaction gas may be greater than 100 and less than <200 (100<the first reaction gas/the second reaction gas<200). That is, the amount of the first reaction gas may be about 100 to about 200 times greater than the amount of the second reaction gas. As an example, the amount of the first reaction gas may be about 100,000 sccm to about 200,000 sccm, and the amount of the second reaction gas may be about 500 sccm to about 1000 sccm. As an example, when the second reaction gas and power are numerically compared, a ratio of power to the second reaction gas may be about 3 to about 4. According to a comparative example derived experimentally, in the case of the second sub-layer including only amorphous silicon (a-Si) without crystallized silicon, a ratio of power to the second reaction gas is about 1 to about 1.5. This may mean that a crystallized structure may be formed in a portion of amorphous silicon (a-Si) by raising power and reducing the amount of the second reaction gas.

In an embodiment, a crystallized structure may be included at a ratio of about 2% to about 25% (Volume %) of the entire second sub-layer 122. In addition, in an embodiment, the thickness t2 of the second sub-layer 122 may be thinner than the thickness t1 of the first sub-layer 121. As an example, the thickness t1 of the first sub-layer 121 may be about 4000 Å to about 7000 Å and the thickness t2 of the second sub-layer 122 may be about 5 Å to about 100 Å. In addition, the second sub-layer 122 may include a Si—H bond forming amorphous silicon (a-Si). As an example, a ratio of silicon (Si) may be 90% or more, and a ratio of hydrogen (H) may be 10% or less. The hydrogen concentration in the second sub-layer 122 may be about 4.0 E+21 atom/cm$^3$ to about 6.0 E+21 atom/cm$^3$. In addition, the second sub-layer 122 may have a preset surface roughness. The surface, that is, the top surface 122u of the second sub-layer 122 may have surface roughness of about 0.02 nm to about 0.5 nm.

As described above, the display apparatus according to an embodiment includes a crystallized structure in at least a portion of the second sub-layer 122, thereby improving characteristics of the second sub-layer 122 and preventing characteristics of the thin-film transistor from being deteriorated by external light. Accordingly, reliability may be improved.

According to an embodiment, a display apparatus with an improved display quality and a method of manufacturing the display apparatus may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including a first base layer, a second base layer arranged over the first base layer, and a first barrier layer disposed between the first base layer and the second base layer;
a first thin-film transistor arranged over the substrate and including a first semiconductor layer and a first gate electrode; and
a second thin-film transistor arranged over the substrate and including a second semiconductor layer and a second gate electrode,
wherein the first barrier layer includes a first sub-layer and a second sub-layer disposed on the first sub-layer, the first sub-layer including an inorganic material and the second sub-layer including amorphous silicon and crystallized silicon, and not including a conductive material,
wherein the first semiconductor layer includes a silicon-based semiconductor material, and the second semiconductor layer includes an oxide-based semiconductor material,
wherein the first thin-film transistor and the second thin-film transistor are disposed in a display area comprising a pixel circuit connected to an organic light-emitting diode,
wherein the second sub-layer includes a top surface having a surface roughness, which represents an unevenness in heights made by each of upper peaks and each of lower valleys in at least one part of the top surface, in a range from 0.02 nm to 0.5 nm, and
wherein the second sub-layer has a hydrogen concentration of from 4.0E+21 atom/cm$^3$ to 6.0E+21 atom/cm$^3$, and the hydrogen concentration included in the second sub-layer controls the surface roughness of the top surface of the second sub-layer.

2. The display apparatus of claim 1, wherein the crystallized silicon in the second sub-layer is from 2% to 25%.

3. The display apparatus of claim 1, wherein the first semiconductor layer and the second semiconductor layer are arranged on different layers.

4. The display apparatus of claim 1, further comprising:
a gate insulating layer arranged between the first semiconductor layer and the first gate electrode; and
an interlayer insulating layer arranged between the first gate electrode and the second semiconductor layer.

5. The display apparatus of claim 4, wherein the second semiconductor layer is arranged directly on the interlayer insulating layer.

6. The display apparatus of claim 1, further comprising a bottom metal layer arranged between the substrate and the second semiconductor layer, the bottom metal layer being disposed on an area corresponding to the second semiconductor layer.

7. The display apparatus of claim 6, wherein the first semiconductor layer does not overlap the bottom metal layer in a plan view.

8. The display apparatus of claim 1, wherein the substrate further includes a second barrier layer disposed on the second base layer and including an inorganic material.

9. The display apparatus of claim 8, further comprising a buffer layer arranged on the second barrier layer,
wherein the first semiconductor layer is arranged directly on the buffer layer.

10. The display apparatus of claim 1, wherein the second sub-layer has an extinction coefficient of from 0.01 to 0.025.

11. The display apparatus of claim 1, wherein the second sub-layer has a thickness of from 5 Å to 100 Å.

12. The display apparatus of claim 1, wherein the first sub-layer has a thickness of from 4000 Å to 7000 Å.

* * * * *